United States Patent
Lee et al.

(10) Patent No.: US 10,566,961 B2
(45) Date of Patent: Feb. 18, 2020

(54) ASYNCHRONOUS CLOCK SIGNAL GENERATOR AND SEMICONDUCTOR DEVICE FOR CORRECTING MULTI-PHASE SIGNALS USING ASYNCHRONOUS CLOCK SIGNAL

(71) Applicants: SK hynix Inc., Icheon (KR); Korea Advanced Institute of Science and Technology, Daejeon (KR)

(72) Inventors: Seonggyu Lee, Namyangju (KR); Yongjo Kim, Gwangmyeong (KR); SeongHwan Cho, Daejeon (KR)

(73) Assignees: SK HYNIX INC., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/279,719

(22) Filed: Feb. 19, 2019

(65) Prior Publication Data

US 2019/0181846 A1    Jun. 13, 2019

Related U.S. Application Data

(62) Division of application No. 15/658,272, filed on Jul. 24, 2017, now Pat. No. 10,250,243.

(30) Foreign Application Priority Data

Dec. 19, 2016    (KR) .................... 10-2016-0173305

(51) Int. Cl.
*H03K 5/00* (2006.01)
*H03K 5/15* (2006.01)

(52) U.S. Cl.
CPC ............... *H03K 5/15033* (2013.01); *H03K 2005/00058* (2013.01)

(58) Field of Classification Search
CPC ............... H03K 5/15033; H03K 2005/00058
(Continued)

(56) References Cited

U.S. PATENT DOCUMENTS

| 7,791,428 B2 * | 9/2010 | Chang ..................... H03L 7/085 331/1 A |
| 7,994,867 B2 * | 8/2011 | Kobayashi ............... H03L 7/08 327/156 |

(Continued)

FOREIGN PATENT DOCUMENTS

KR    20160060515    5/2016

OTHER PUBLICATIONS

Andreani, et al., "Multihit Multichannel Time-to-Digital Converter with ±1% Differential Nonlinearity and Near Optimal Time Resolution," IEEE Journal of Solid-State Circuits, 1998, vol. 33 (4), pp. 650-656.
(Continued)

*Primary Examiner* — Ryan Jager

(57) ABSTRACT

A semiconductor device includes a delay circuit configured to adjust a delay amount of multi-phase input signals to output multi-phase signals; a clock generator configured to output a clock signal that is not synchronized with an input signal which corresponds to one of the multi-phase signals; a detector circuit configured to generate a pulse signal corresponding to a phase difference between a reference signal corresponding to a predetermined one of the multi-phase signals and a comparison signal corresponding to a selected one of the multi-phase signals and to sample the pulse signal according to the clock signal; and a controller circuit configured to output a delay control signal for controlling a delay amount of the multi-phase input signals or controlling a delay amount of the comparison signal accord- (Continued)

ing to a result of calculating an output of the detector circuit and a reference value corresponding to the phase difference.

5 Claims, 15 Drawing Sheets

(58) Field of Classification Search
USPC .......................................................... 327/270
See application file for complete search history.

(56) References Cited

U.S. PATENT DOCUMENTS

| | | | | |
|---|---|---|---|---|
| 8,170,171 | B2* | 5/2012 | Kobayashi | H03C 3/0941 |
| | | | | 375/376 |
| 8,384,451 | B2* | 2/2013 | Matsuda | H03L 7/085 |
| | | | | 327/156 |
| 8,400,196 | B2* | 3/2013 | Kim | G11C 7/222 |
| | | | | 327/156 |
| 10,250,243 | B2* | 4/2019 | Lee | H03K 5/15033 |
| 2010/0214028 | A1* | 8/2010 | Kobayashi | H03L 7/08 |
| | | | | 331/18 |
| 2018/0175843 | A1* | 6/2018 | Lee | H03K 5/15033 |

OTHER PUBLICATIONS

Doernberg, et al., "Full-Speed Testing of A/D Converters," IEEE Journal of Solid-State Circuits, 1984, vol. 19 (6), pp. 820-827.

Dudek, et al., "A High-Resolution CMOS Time-to-Digital Converter Utilizing a Vernier Delay Line," IEEE Journal of Solid-State Circuits, 2000, vol. 35 (2), pp. 240-247.

Hsiao, et al., "A Low-Jitter 8-to-10GHz Distributed DLL for Multiple-Phase Clock Generation," IEEE International Solid-State Circuits Conference—Digest of Technical Papers, 2008, pp. 514-515, 632.

Hsueh, et al., "A 25.6Gb/s Differential and DDR4/GDDR5 Dual-Mode Transmitter with Digital Clock Calibration in 22nm CMOS," IEEE International Solid-State Circuits Conference Digest of Technical Papers (ISSCC), 2014, pp. 444-446.

Knotts, et al., "WP 3.6: a 500MHz Time Digitizer IC with 15.625ps Resolution," IEEE International Solid-Sate Circuits Conference, 1994, pp. 58-59.

Lee, et al., "A Sub-10-ps Multiphase Sampling System Using Redundancy," IEEE Journal of Solid-State Circuits, 2006, vol. 41 (1), pp. 265-273.

Mansuri, et al., "An On-Die All-Digital Delay Measurement Circuit with 250fs Accuracy," ymposium on VLSI Circuits (VLSIC), 2012, pp. 98-99.

Pellerano, et al., "A 4.75-GHz Fractional Frequency Divider-by-1.25 With TDC-Based All-Digital Spur Calibration in 45-nm CMOS," IEEE Journal of Solid-State Circuits, 2009, vol. 44 (12), pp. 3422-3433.

Staszewski, et al., "All-Digital Frequency Synthesizer in Deep-Submicron CMOS," John Wiley & Sons, 2006, pp. 17-18.

Xia, et al., "Sub-2-ps, Static Phase Error Calibration Technique Incorporating Measurement Uncertainty Cancellation for Multi-Gigahertz Time-Interleaved T/H Circuits," IEEE Transactions on Circuits and Systems, 2012, vol. 59 92), pp. 276-284.

* cited by examiner

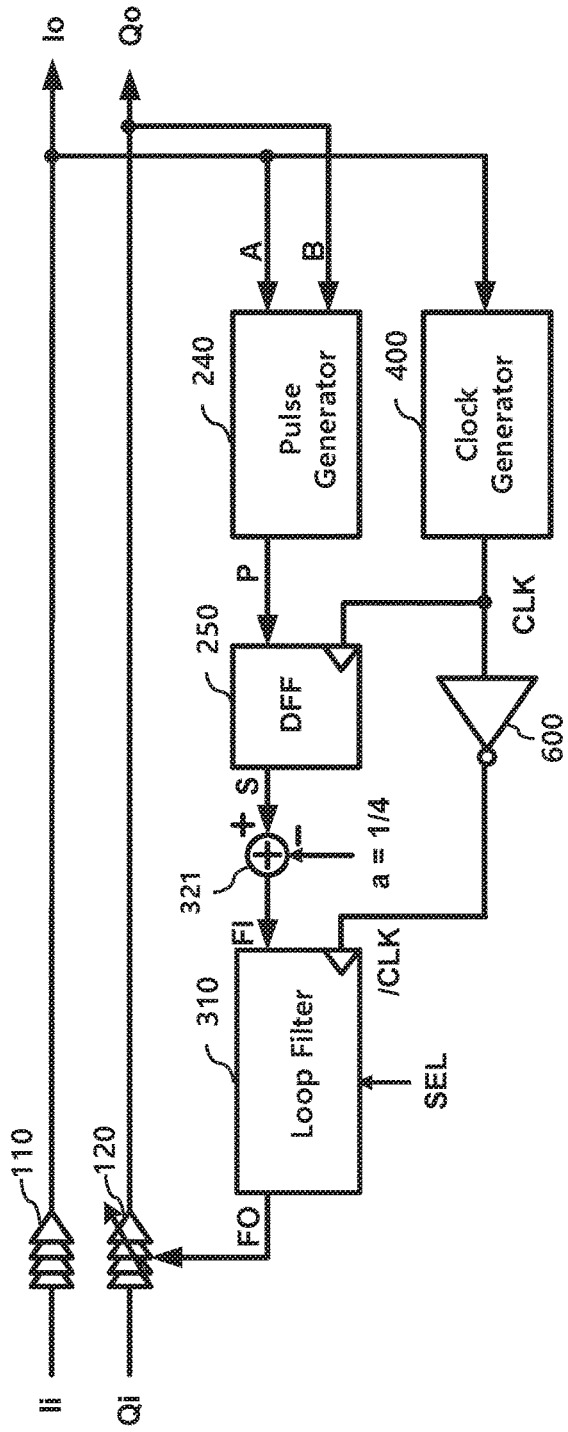
FIG. 10A
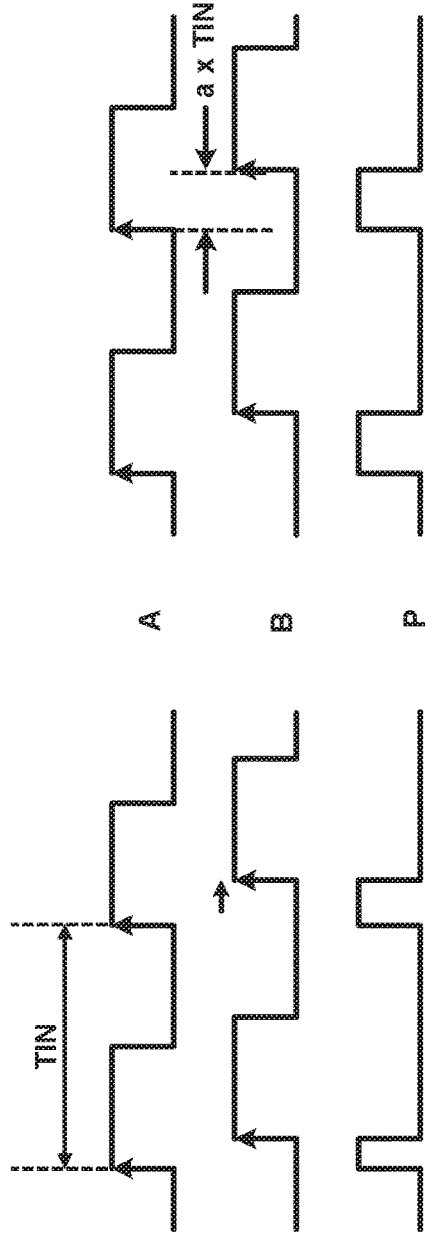
FIG. 10C
FIG. 10B

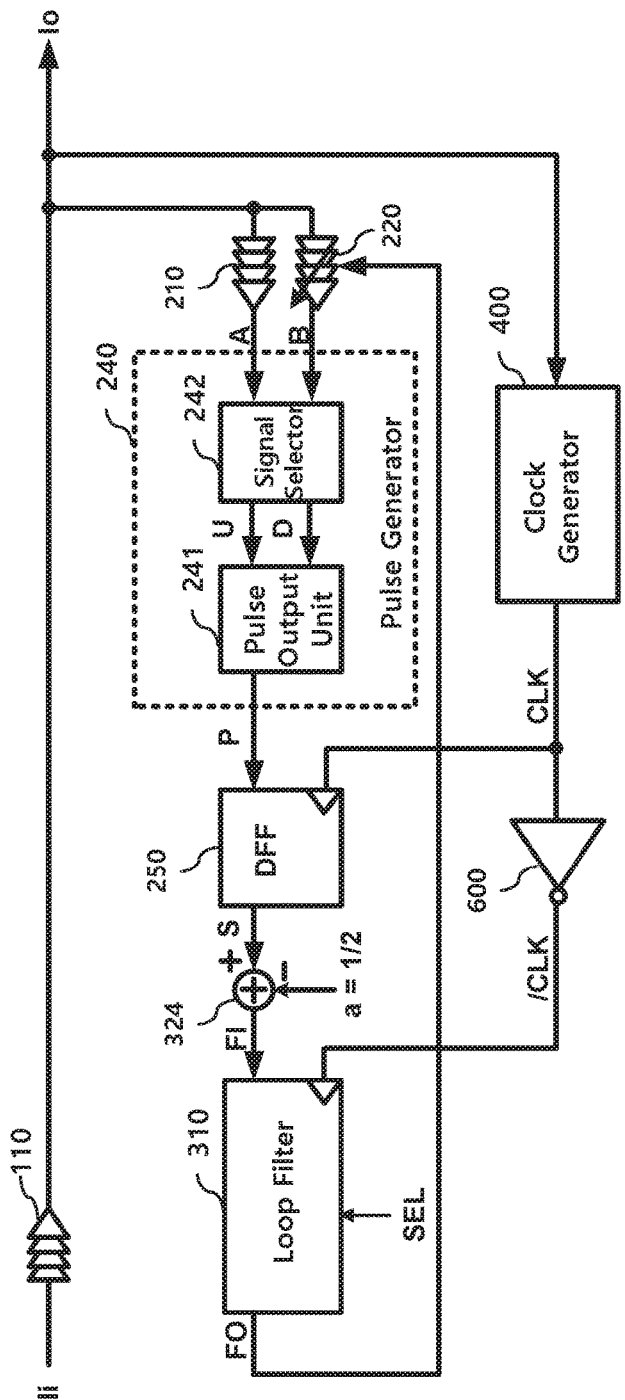
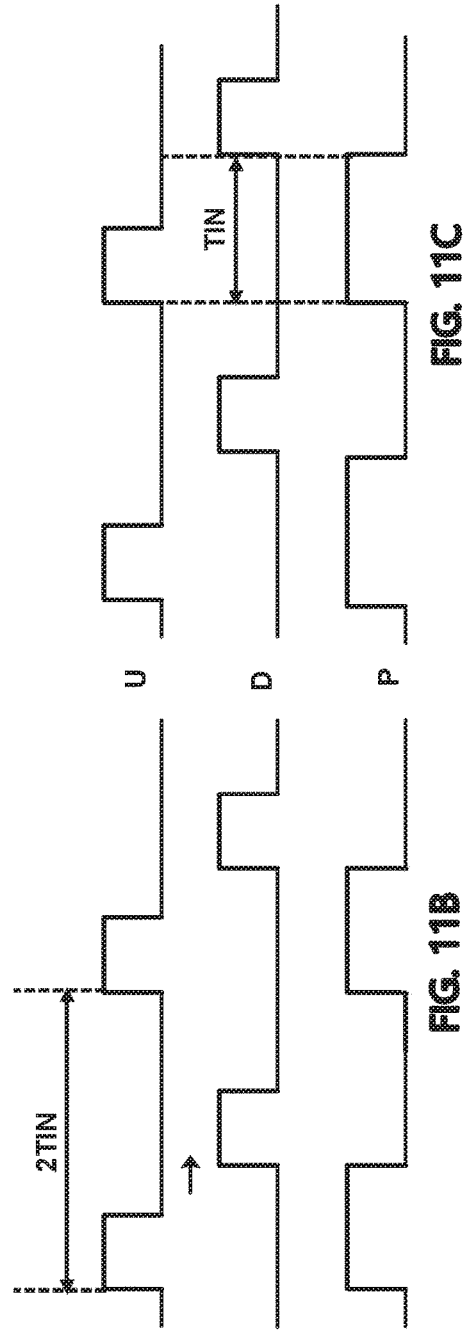
FIG. 11A
FIG. 11B
FIG. 11C

ASYNCHRONOUS CLOCK SIGNAL GENERATOR AND SEMICONDUCTOR DEVICE FOR CORRECTING MULTI-PHASE SIGNALS USING ASYNCHRONOUS CLOCK SIGNAL

CROSS-REFERENCE TO RELATED APPLICATIONS

This application is a divisional of U.S. application Ser. No. 15/658,272, filed on Jul. 24, 2017, which claims priority of Korean Patent Application No. 10-2016-0173305, filed on Dec. 19, 2016, which is incorporated herein by reference in its entirety.

BACKGROUND

1. Field

Exemplary embodiments of the present invention relate to a semiconductor device for eliminating a phase error between multi-phase signals using an asynchronous clock signal and an asynchronous clock signal generator for generating an asynchronous clock signal.

2. Description of the Related Art

FIG. 1A is a circuit diagram of a conventional multi-phase signal generator and FIG. 1B is a timing diagram showing its operation.

As shown in FIG. 1A, a conventional multi-phase signal generator 10 includes a plurality of variable delay circuits 11 for delaying an input clock signal Vp0 to generate a plurality of multi-phase signals, a phase comparator 20 for comparing the phase of the input clock signal Vp0 with the signal Vp5 output from the multi-phase signal generator 10, a charge pump 30 whose output voltage is adjusted by the output of the phase comparator 20, and a filter 40 for controlling the amount of delay of the multi-phase signal generator 10 in accordance with the output of the charge pump 30.

In FIG. 1A, it is preferable that two signals of adjacent phases among the multi-phase signals Vp0 to Vp4 have a phase difference that corresponds to one fifth of period of the input signal Vp0. However, as shown in FIG. 1B, the conventional multiphase signal generator compares the input signal Vp0 and the output signal Vp5, and the filter 40 stops controlling at a point where the phases of the two signals coincide with each other.

Therefore, when the amount of delay of each delay circuit 11 in the multi-phase signal generator 10 varies due to process variation or the like, the phase difference between two adjacent signals becomes uneven. That is, two adjacent signals among the multi-phase signals Vp0 to Vp4 may not have a phase difference that corresponds to one fifth of a period of the input signal Vp0.

Accordingly, a semiconductor device capable of accurately controlling the phase difference of the multi-phase signals is required.

SUMMARY

Various embodiments are directed to a semiconductor device for eliminating a phase error in multi-phase signals by comparing multi-phase signals using an asynchronous clock signal and by adjusting a delay amount of each signal according to the result of comparison, and an asynchronous clock signal generator for generating the asynchronous clock signal.

In an embodiment, a semiconductor device may include a delay circuit configured to adjust a delay amount of multi-phase input signals to output multi-phase signals; a clock generator configured to output a clock signal that is not synchronized with an input signal which corresponds to one of the multi-phase signals; a detector configured to generate a pulse signal corresponding to a phase difference between a reference signal corresponding to a predetermined one of the multi-phase signals and a comparison signal corresponding to a selected one of the multi-phase signals and to sample the pulse signal according to the clock signal; and a controller configured to output a delay control signal for controlling a delay amount of the multi-phase input signals or controlling a delay amount of the comparison signal according to a result of calculating an output of the detector and a reference value corresponding to the phase difference.

In an embodiment, an asynchronous clock signal generator may include a counter configured to count the input signal for one period of the clock signal; a flip-flop configured to latch an output of the counter according to the clock signal; a multiplier configured to multiply an output of the flip-flop by M (M is a natural number greater than 1); a subtractor configured to subtract N (N is a natural number smaller than M, M and N are relatively prime) from an output of the multiplier; a digital filter configured to filter an output of the subtractor according to the clock signal; and a digitally controlled oscillator configured to output the clock signal according to output of the digital filter.

BRIEF DESCRIPTION OF THE DRAWINGS

FIGS. 10A, 10B, and 10C are diagrams illustrating a phase correction operation of FIG. 2, according to an embodiment.

FIGS. 11A, 11B, and 11C are diagrams illustrating an offset correction operation of FIG. 2, according to an embodiment.

DETAILED DESCRIPTION

Hereinafter, various embodiments will be described below in more detail with reference to the accompanying drawings.

In the disclosure, a quadrature signal is used as an example of a multi-phase signal, but embodiments are not limited thereto.

The input signals are represented by the first input signal Ii, the second input signal Qi, the third input signal IBi, and the fourth input signal QBi and corresponding output signals are represented by the first signal Io, the second signal Qo, the third signal IBo and the fourth signal QBo.

Figure 1A:
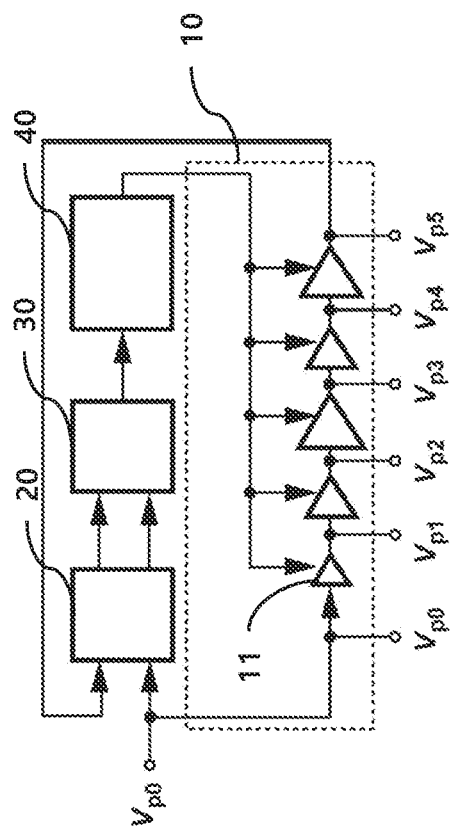
FIG. 1A is a diagram illustrating a multi-phase signal generator.
Figure 1B:
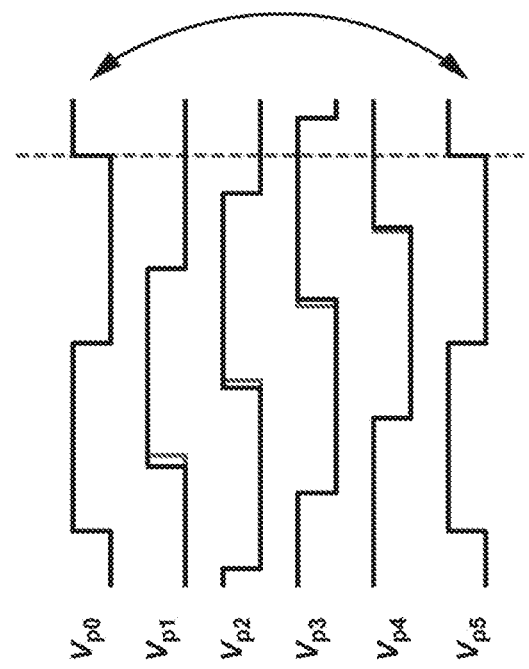
FIG. 1B illustrates signals of the multi-phase signal generator of FIG. 1A.
Figure 2:
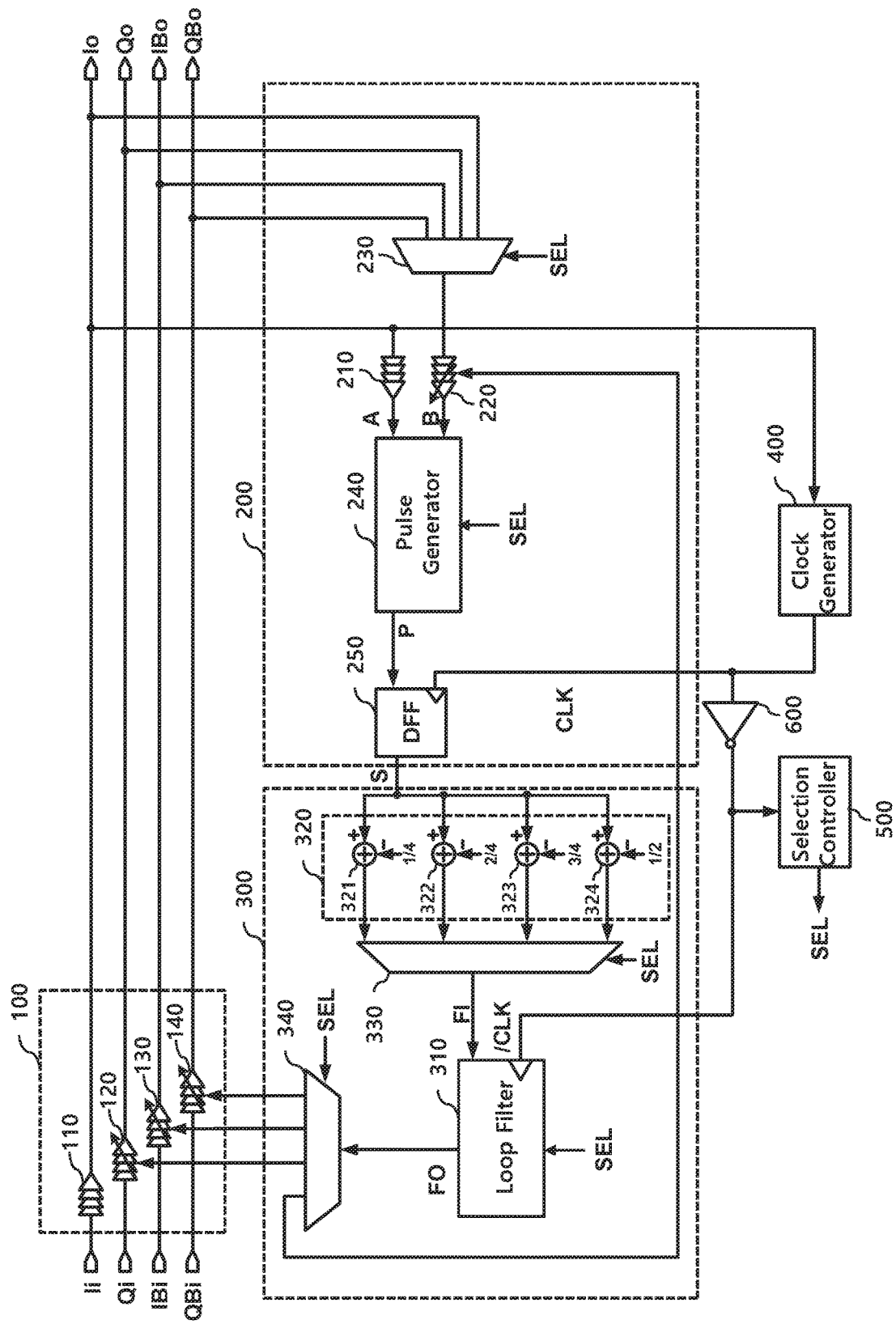
FIG. 2 is a diagram illustrating a semiconductor device according to an embodiment.

FIG. 2 is a diagram of a semiconductor device according to an embodiment of the present invention.

The semiconductor device according to an embodiment includes a first delay circuit 100, a detection circuit 200, a controller 300, and a clock generator 400.

The semiconductor device according to the embodiment may further include an inverter 600 for inverting a clock signal and a selection controller 500 for generating a selection signal SEL from the inverted clock signal.

The first delay circuit 100 includes an 1-1st delay circuit 110 for delaying the first input signal Ii and outputting the first signal Io and a 1-2nd delay circuit 120 for delaying the second input signal Qi according to the delay control signal FO and outputting the second output signal Qo, a 1-3rd delay circuit 130 for delaying the third input signal IBi according to the delay control signal FO and outputting a third signal IBo, and a 1-4th delay circuit 140 for delaying the fourth input signal QBi according to the delay control signal FO and outputting the fourth signal QBo.

The 1-1st delay circuit 110 represents the amount of delay between the first input signal Ti and the first signal To. Therefore, the 1-1st delay circuit 110 may not be physically included in some embodiments.

The delay amounts of the 1-2nd delay circuit 120, the 1-3rd delay circuit 130 and the 1-4th delay circuit 140 are controlled by the delay control signal FO of the controller 300.

Each of the 1-2nd delay circuit 120 to the 1-4th delay circuit 140 may be implemented with a digitally controlled delay line (DCDL). Various implementations of the DCDL are known in the art, so a detailed description thereof will be omitted. In an embodiment, a DCDL may include a latch or register for storing a control signal provided to the DCDL.

The delay control signal FO of the controller 300 may be a digital code.

Delay amount of each of the 1-2nd to 1-4th delay units 120~140 in the present embodiment is assumed to increase when a value of the delay control signal FO provided to each of them increases and to decrease when the value of the delay control signal FO provided to them decreases.

The detector 200 selects two signals among the first signal Io to the fourth signal QBo, one to serve as a reference signal and the other to serve as a comparison signal, to generate a pulse signal corresponding to the phase difference therebetween and outputs a sampling result using an asynchronous clock signal CLK.

In this embodiment, the first signal Io corresponds to the reference signal and any one of the remaining signals corresponds to the comparison signal during the phase correction operation.

In the present embodiment, the first signal Io corresponds to the reference signal and the comparison signal during the offset correction operation.

The detection circuit 200 includes a 2-1st delay circuit 210, a 2-2nd delay circuit 220, a first selection circuit 230, a pulse generator 240, and a sampler 250.

The 2-1st delay circuit 210 delays the first signal Io to output the reference signal A and the 2-2nd delay circuit 220 outputs the comparison signal B by delaying the output according to a provided value of the delay control signal FO.

The 2-1st delay circuit 210 represents a fixed amount of delay that it takes until the first signal Io is input to the pulse generator 240, and may not be included as a physical delay element in other embodiments.

The 2-2nd delay circuit 220 may be implemented using a DCDL.

In this embodiment, the delay amount of the 2-2nd delay circuit 220 is assumed to increase when the provided value of the delay control signal FO increases and to decrease when the provided value of the delay control signal FO decreases.

The pulse generator 240 generates a pulse signal P from the reference signal A and the comparison signal B.

The pulse signal P has a high level between the rising edge of the reference signal A and the rising edge of the comparison signal B, when the first selector 230 selects any one of the second signal Qo to the fourth signal QBo.

Therefore, the pulse width of the pulse signal P corresponds to the phase difference between the first signal Io and any one of the second signal Qo to the fourth signal QBo.

Figure 6:
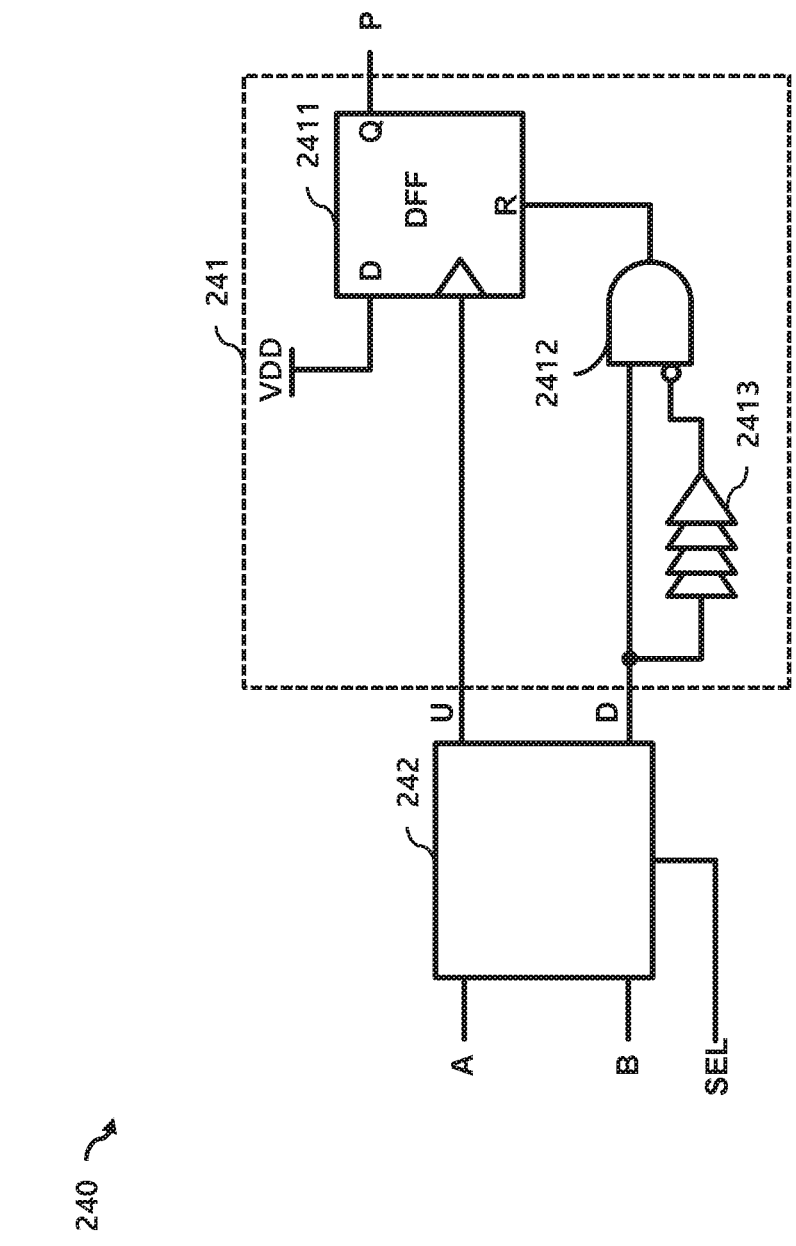
FIG. 6 is a diagram illustrating a pulse generator of FIG. 2 according to an embodiment.

When the first selector 230 selects the first signal Io, the pulse signal P is generated by the first intermediate signal U and the second intermediate signal D which are derived from the reference signal A and the comparison signal B, as shown in FIG. 6.

At this time, the pulse width of the pulse signal P corresponds to an offset inherent in the pulse generator 240.

This will be described in detail with reference to FIGS. 6 to 8.

The sampler 250 samples the pulse signal P using an asynchronous clock signal CLK (hereinafter referred to as a clock signal CLK) to output a sample signal S.

In this embodiment, the sampler 250 samples the value of the pulse signal P at the rising edge of the clock signal CLK.

The clock signal CLK is a signal that is asynchronous to the first signal Io. Accordingly, the pulse width can be derived from the number of the plurality of sample signals S obtained while repeating the feedback loop a plurality of times.

This will be described in detail with reference to FIGS. 3 to 5 below.

The controller 300 includes a calculation circuit 320 for calculating a sample signal S with a reference value, a second selection circuit 330 for selecting an output of the calculation circuit 320, a loop filter 310 for filtering the output FI of the second selection circuit 330, and a third selector 340 for outputting the delay control signal FO output from the loop filter 310 to a selected path.

The calculation circuit 320 includes a first calculation circuit 321 for subtracting 1/4 from the sample signal S, a second calculation circuit 322 for subtracting 2/4 from the sample signal S, a third calculation circuit 323 for subtracting 3/4 from the sample signal S, and a fourth calculation circuit 324 for subtracting 1/2 from the sample signal S, as shown in FIG. 2.

1/4 provided to the first calculation circuit 321 is related to a phase difference of 90 degrees, 2/4 provided to the second calculation circuit 322 is related to a phase difference of 180 degrees, 3/4 provided to the third calculation circuit 323 is related to the phase difference of 270 degrees, and 1/2 that is provided to the fourth operation circuit 324 is related to the phase difference of 180 degrees.

The loop filter 310 controls amounts of delays of the first delay circuit 100 or an amount of delay of the 2-2nd delay circuit 220 by increasing or decreasing the delay control signal FO according to the output FI of the calculation circuit 320.

The specific configuration of the loop filter 310 will be described with reference to FIG. 14.

The calculation result of the calculation circuit 320 corresponds to the error value. Since the feedback loop is a negative feedback loop, the average value of the calculation results converges to 0 as the feedback control is repeated.

As a result, the delay amount of the 1-2nd delay circuit 120 converges to a value such that the phase difference between the first signal Io and the second signal Qo becomes 90 degrees, the delay amount of the 1-3rd delay circuit 140 converges to a value such that the phase difference between the first signal Io and the third signal IBo becomes 180 degrees and the delay amount of the 1-4th delay circuit 140 converges to a value such that the phase difference between the first signal Io and the fourth signal Qbo becomes 270 degrees.

The delay amount of the 2-2nd delay circuit 220 converges to a value such that the total offset existing in the feedback loop including the pulse generator 240 becomes zero.

This will be further described in detail below.

Figure 3:
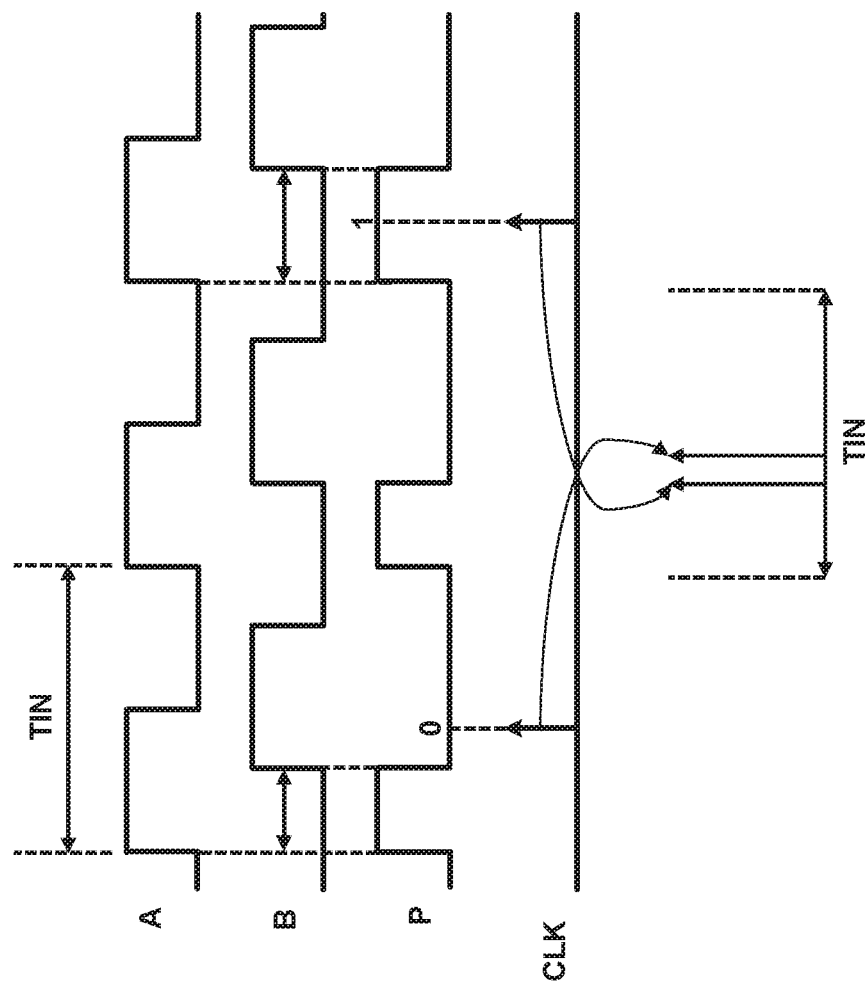
FIG. 3 is a diagram illustrating an operation of a semiconductor device according to an embodiment.

FIG. 3 is a timing diagram illustrating an operation of an embodiment.

FIG. 3 shows that the pulse signal P is generated from the reference signal A and the comparison signal B and that the pulse signal P is sampled using the clock signal CLK.

In order to measure the width of a pulse signal, a method of generating a clock signal whose period is much shorter than that of the reference signal A and continuously sampling the pulse signal with the clock signal may be considered.

However, the reference signal A is generated from the first signal Io. When the signal is transmitted at a high speed, the frequency of the reference signal A may be several GHz.

In this case, in order to accurately measure the pulse width at the pulse signal, there is a problem that a clock signal whose frequency is several tens to several hundred GHz is required.

Accordingly, in the present invention, instead of generating a clock signal having a frequency significantly higher than the frequency of the input signal to be phase-corrected, an asynchronous clock signal CLK not synchronized with the input signal is used as a clock signal. The frequency of the clock signal CLK may be lower than that of the input signal.

In FIG. 3, the clock signal CLK is represented by an arrow at the rising edge of the clock signal.

Both the reference signal A and the comparison signal B have the same period TIN as the signal whose phase is corrected and the pulse signal P has the same period TIN.

The position at which the clock signal CLK samples the pulse signal P can be mapped to one period TIN of the pulse signal P as shown in FIG. 3.

At each position, the sample signal P has a value of 0 or 1, and the number of 1's relative to the total number of samples corresponds to the pulse width, that is, the phase difference between the reference signal A and the comparison signal B.

However, it is preferable that mapped sampling positions are uniformly distributed for one period of the pulse signal P when the samples are accumulated for a predetermined time.

To this end, it is preferable that the clock signal CLK is not synchronized with the input signal.

Figure 4:
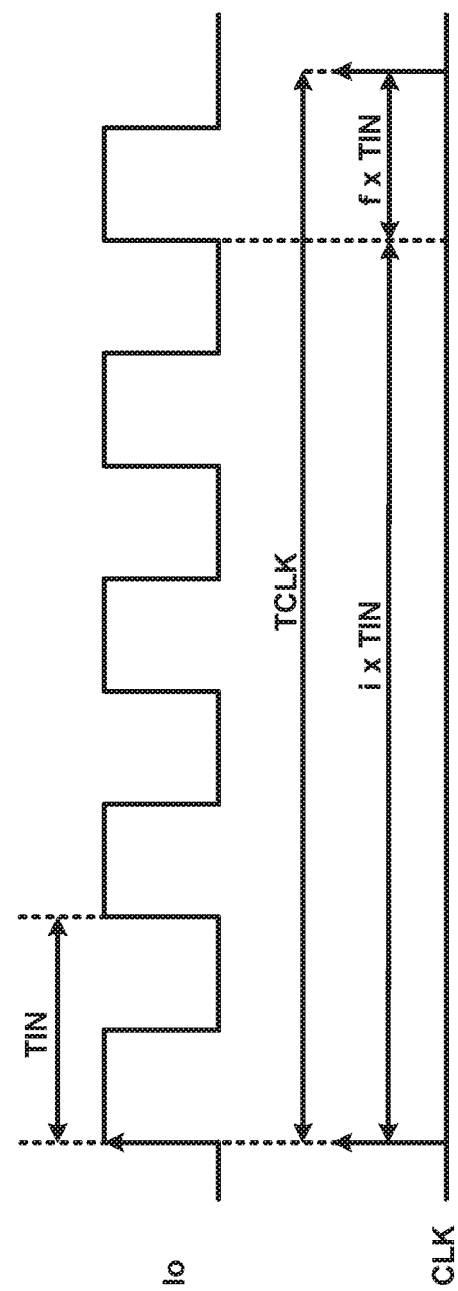
FIG. 4 is a timing diagram illustrating a relation between an asynchronous clock signal and an input signal, according to an embodiment.

FIG. 4 is a timing diagram illustrating a relationship between an asynchronous clock signal and an input signal.

In this embodiment, the period TCLK of the asynchronous clock signal CLK is set longer than the period TIN of the first signal Io.

Accordingly, the relationship between the two periods can be expressed as Equation 1.

$$TCLK=(i+f)TIN \quad \text{[Equation 1]}$$

In Equation 1, i is a natural number and f is a number greater than or equal to 0 and less than 1.

When f is 0, the samples are not uniformly distributed during the period of the input signal but are concentrated at a certain position for the period TCLK is a multiple of the period TIN, which is not preferable.

It is preferable that f be an irrational number. In this case, as samples increases, the sampling position can be evenly distributed during one period of the input signal TIN.

However, f can be set to rational number (N/M, wherein M and N are natural numbers) in order to implement the circuit more easily than when f is an irrational number.

To make f have similar performance to an irrational number, M and N are selected to be relatively prime.

Figure 5B:
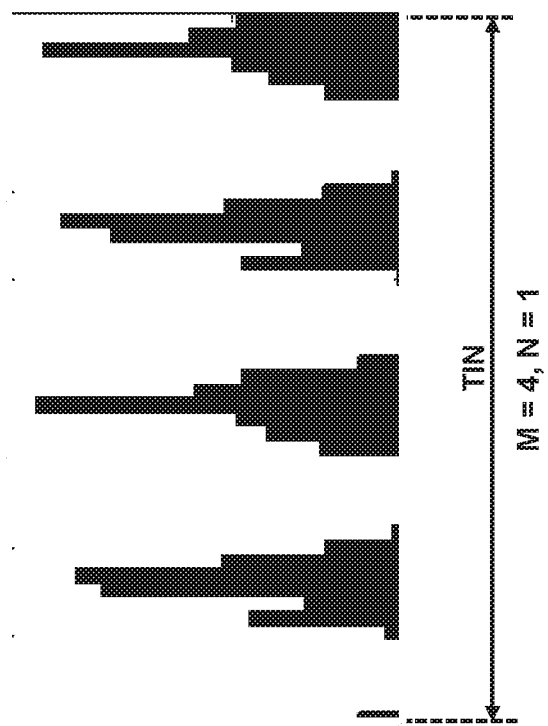
FIGS. 5A and 5B are graphs illustrating sampling results according to an asynchronous clock signal, according to embodiments.
Figure 5A:
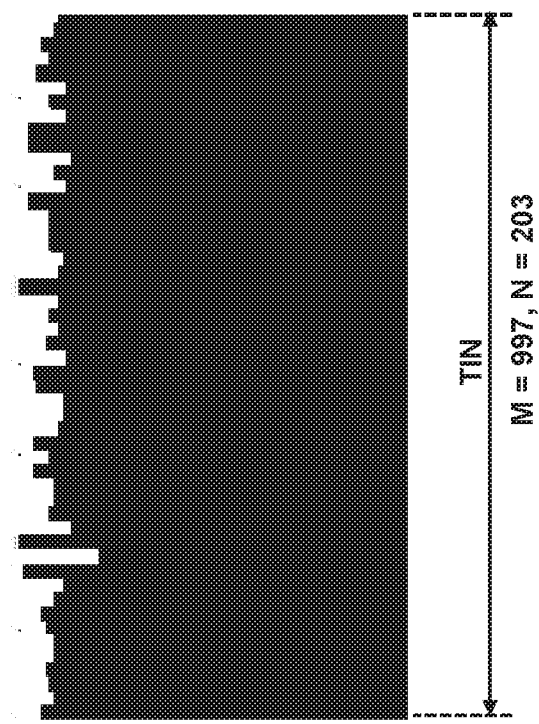

FIGS. 5A and 5B are graphs illustrating a result of sampling by the asynchronous clock signal.

FIG. 5A shows a result of mapping the sampling position to one period TIN of the input signal when M=4 and N=1, and FIG. 5B shows a result of sampling TIN when each of M=997 and N=203, where M and N are relatively prime.

As shown in FIG. 5A, the sampling position is not uniformly distributed within one period of the input signal but is concentrated at a certain point when M=4 and N=1.

As shown FIG. 5B, the sampling positions are evenly distributed within one period of the input signal when M=997 and N=203.

The minimum number of samples to obtain a certain level of resolution (for example, less than 1%) for given values of M and N can be determined through simulation.

The inventors have found that as M gets larger, the minimum number of samples required to obtain 1% resolution gets smaller. For example, when M is greater than or equal to 60 and the input signal period TIN is 800 picoseconds (ps), a 1% resolution (8 ps) can be achieved with only 350 samples. And as M gets smaller, number of required samples gets larger.

However, if N/M is close to 0 or close to 1 or close to 1/K (K is a natural number greater than or equal to 2), the uniformity of distribution of samples deteriorates though M is large and N and M are relatively prime. In this case, it has been found that the number of samples must be further increased to achieve uniform distribution of samples and a desired resolution.

For example, when the value of N/M is close to 1/2, the uniformity deteriorates to maximize the standard deviation. However, in this case, it has been found that the distribution gets uniform when the number of samples is increased by 16 times.

In addition, the inventors have found that the uniformity improves when the jitter increases in the clock signal CLK. For example, when the period of the input signal TIN is 800 ps, the number of minimum samples to obtain 1% resolution tends to be similar regardless of the value of M when the RMS value of jitter is 30 ps compared with the case of 10 ps.

In other words, in embodiments of the present invention an asynchronous clock signal is used as a sampling clock whose frequency is lower than that of the input signal and which is asynchronous to the input signal, thereby reducing the burden of generating the high frequency signal. This can lead to cost savings and improved power efficiency.

FIG. 6 is a detailed circuit diagram of the pulse generator 240 of FIG. 2, according to an embodiment.

The pulse generator 240 includes a pulse output circuit 241 and a signal selector 242.

In this embodiment, the pulse output circuit 241 generates a pulse signal P that rises at the rising edge of the first intermediate signal U and falls at the rising edge of the second intermediate signal D.

In this embodiment, the pulse output circuit 241 includes a flip-flop 2411 for latching and outputting a high-level signal when the first intermediate signal U is activated.

The pulse output circuit 241 also includes a gate circuit 2412 which is activated at the rising edge of the second intermediate signal D and outputs a pulse signal falling after a predetermined delay time and a delay circuit 2413 which delays the second intermediate signal D for a predetermined time.

The output of the flip-flop 2411 is reset when the gate circuit 2412 is activated so that the pulse signal P rises to a high level at the rising edge of the first intermediate signal U, and falls to a low level at the rising edge of the second intermediate signal D.

Accordingly, the width of the high-level section of the pulse signal P represents the phase difference between the first intermediate signal U and the second intermediate signal D.

The signal selector 242 generates the first intermediate signal U from the reference signal A according to a selection signal SEL and generates the second intermediate signal D from the comparison signal B.

In this embodiment, the selection signal SEL is a 2-bit digital signal. The selection controller 500 shown in FIG. 2 alternately outputs one of "01", "10", "11", and "00" according to the clock signal CLK at the falling edge of the clock signal CLK.

The first selector 230 of FIG. 2 selects the second signal Qo when the selection signal SEL is "01", selects the third signal IBo when the selection signal SEL is "10", selects the fourth signal QBo when the selection signal SEL is "11", and selects the first signal Io when the selection signal SEL is "00".

The second selector 330 of FIG. 2 selects the output of the first calculator 321 when the selection signal SEL is "01", selects the output of the second calculator 322 when the selection signal SEL is "10", selects the output of the third calculator 323 when the selection signal SEL is "11", and selects the output of the fourth calculator 324 when the selection signal SEL is "00".

The third selector 340 of FIG. 2 provides the delay control signal FO, which is the output of the loop filter 310, to the 1-2nd delay circuit 120 when the selection signal SEL is "01", provides the delay control signal FO to the 1-3rd delay circuit 130 when the selection signal SEL is "10", provides the delay control signal FO to the 1-4th delay circuit 140 when the selection signal SEL is "11", and provides the delay control signal FO to the 2-2nd delay circuit 220 when the selection signal SEL is "00".

Except for the case where the selection signal SEL is "00", the phase difference between the first signal Io and one among the second signal Qo to the fourth signal QBo is controlled.

Accordingly, the first intermediate signal U is substantially identical to the reference signal A and the second intermediate signal D is substantially identical to the comparison signal B except when the selection signal SEL is "00".

That is, in this case, the signal selector 242 passes the reference signal A to output the first intermediate signal U, and passes the comparison signal B to output the second intermediate signal D.

When the selection signal SEL is "00", the offset of the feedback loop is removed. To this end, the first signal Io is selected in the first selector 230.

Since the reference signal A is also provided from the first signal Io, if the pulse signal P is generated using the reference signal A and the comparison signal B, the pulse width of the pulse signal P may become very small, which make measuring the width very difficult.

Accordingly, in the present embodiment, when the selection signal SEL is "00", the period of the reference signal A is doubled to generate the first intermediate signal U, and the period of the comparison signal B is doubled to generate the second intermediate signal D.

At this time, the first intermediate signal U has a high level for the first half period of the two periods of the reference signal A and a low level for the remaining period.

The second intermediate signal D has a high level for the third half period of the two periods of the comparison signal B and a low level for the remaining period.

Figure 8:
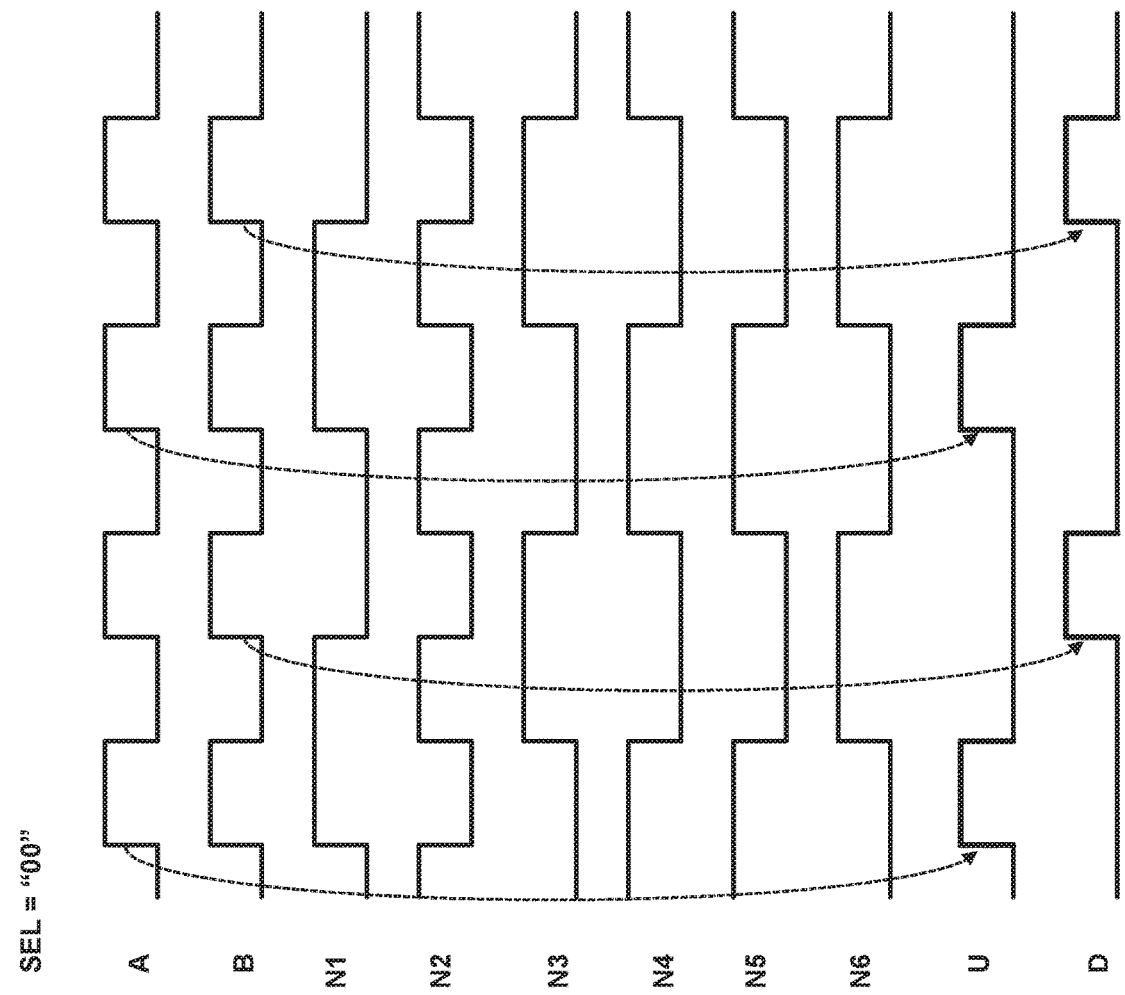
FIG. 8 is a timing diagram illustrating an operation of a signal selector of FIG. 7.
Figure 9:
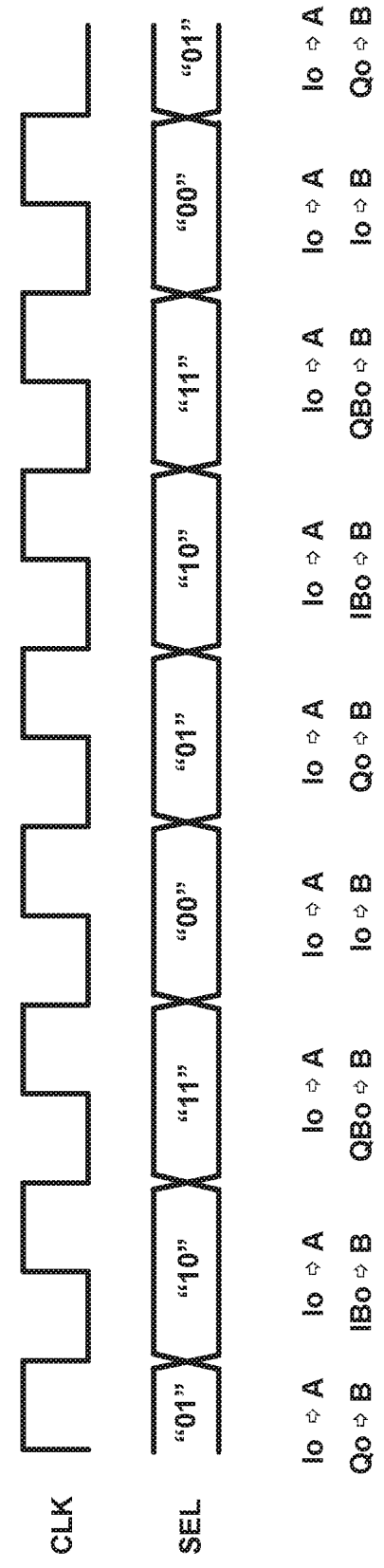
FIG. 9 is a timing diagram illustrating an operation of selection controller of FIG. 2.

The relationships between the reference signal A, the comparison signal B, the first intermediate signal U and the second intermediate signal D when the selection signal SEL is "00" are disclosed in FIG. 8.

Figure 7:
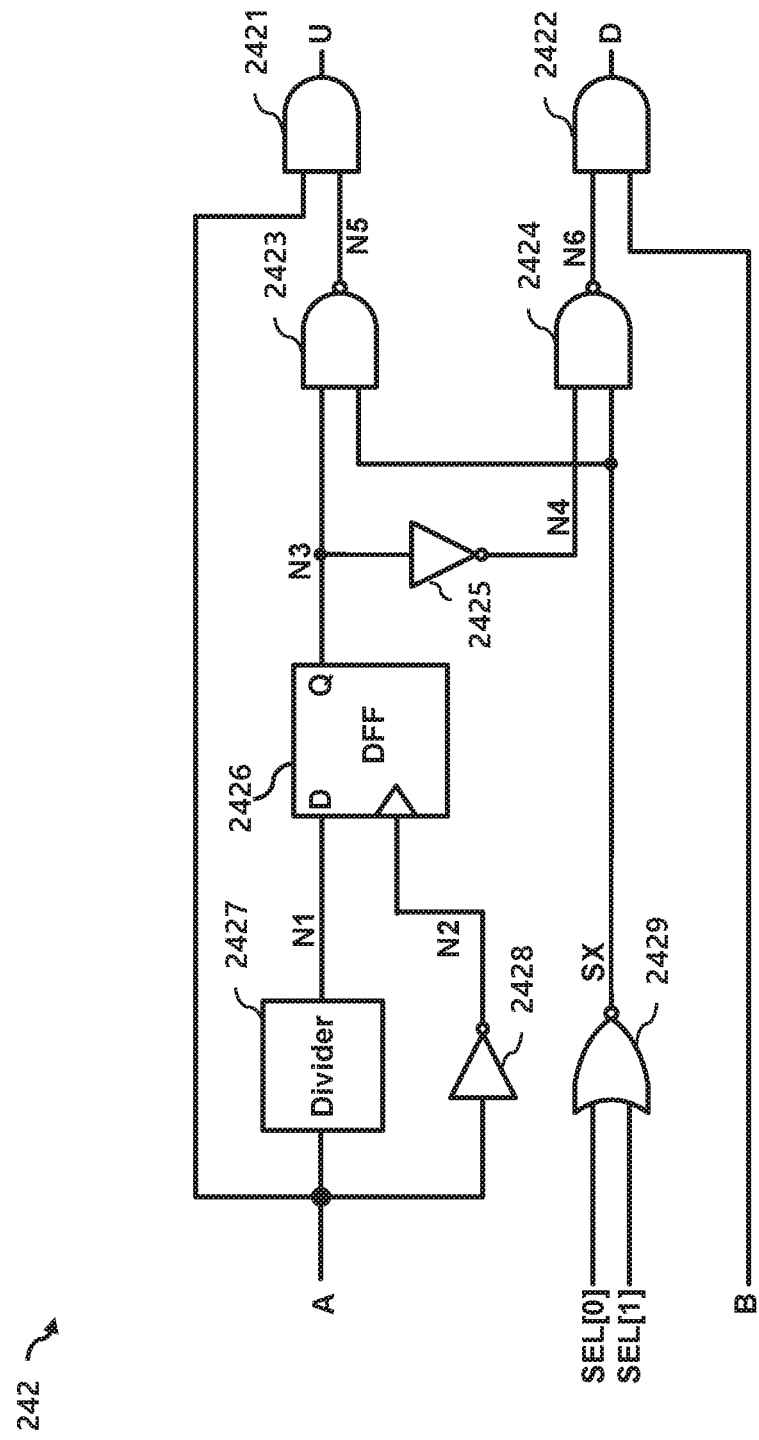
FIG. 7 is a diagram illustrating a signal selector of FIG. 6, according to an embodiment.

FIG. 7 is a detailed circuit diagram of the signal selector 242 of FIG. 6.

The output SX of the NOR gate 2429 becomes "1" when the selection signal SEL is "00" and becomes "0" otherwise.

When the output SX is "0" (when the selection signal is not "00"), the outputs N5 and N6 of the two NAND gates 2423 and 2424 become "1". Therefore, the first intermediate signal U becomes substantially identical to the reference signal A and the second intermediate signal D becomes substantially identical to the comparison signal B.

The operation of the signal selector 242 will be described with reference to the timing diagram of FIG. 8 when the output SX is "1" (when the selection signal is "00").

In this embodiment, the frequency divider 2427 outputs a signal N1 obtained by dividing the reference signal A by two and the flip-flop 2426 outputs the signal N3 by latching the signal N1 at the rising edge of the signal N2 which is an output of an inverter 2428 inverting the reference signal A.

Accordingly, the output signal N3 of the flip-flop 2426 corresponds to a signal generated by delaying the output of the frequency divider N1 by 1/2 period of the reference signal A.

Because the output SX is "1", NAND gates 2423 and 2424 operate as inverters so that the output N5 of NAND gate 2423 becomes substantially identical to an inversion of the output of flip-flop N3 and the output of NAND gate 2424 becomes substantially identical to the output N3.

Since the AND gate 2421 outputs a high-level signal when the reference signal A and the output N5 are at the high level, the first intermediate signal U becomes high at the odd-numbered high-level sections of the reference signal A and becomes low at the other sections of the reference signal A.

Since the AND gate 2422 outputs a high-level signal when the reference signal B and the output N6 are at the high level, the second intermediate signal D becomes high at the even-numbered high-level sections of the comparison signal B and becomes low at the other sections of the comparison signal B.

As described above, when the selection signal SEL is "00", the periods of the first intermediate signal U and the second intermediate signal D become twice of the period TIN of the input signal Io, and the pulse width generated thereby is also increased by one period TIN of the input signal Io as compared with the original offset.

Accordingly, the asynchronous clock signal CLK output from the clock generator 400 can be used as it is to remove the offset component without using a separate high-frequency clock signal.

The high-level interval of the first intermediate signal U or the second intermediate signal D in the embodiment does not affect the generation of the pulse signal P.

In this embodiment, the periods of the first intermediate signal U and the second intermediate signal D are twice the period of the input signal, but the multiple of the period may be larger in other embodiments.

Also, the pulse positions of the first intermediate signal U and the second intermediate signal D can be adjusted differently according to the embodiment.

The specific implementation of the signal selector 242 may vary depending on the embodiment. In this case, the reference value input to the fourth calculator 324 may be adjusted to a value other than 1/2 .

FIG. 10 is a diagram illustrating phase correction operation of FIG. 2.

FIG. 10 illustrates a case where the selection signal SEL is "01", and a 2-1st delay circuit 210, a 2-2nd delay circuit 220, a first selector 230, a second selector 330 and the third selector 340 are omitted in FIG. 10A.

The pulse generator 240 generates a pulse signal P corresponding to the phase difference between the reference signal A and the comparison signal B, that is, the phase difference between the first signal Io and the second signal Qo.

The sampler 250 samples the pulse signal P according to the clock signal CLK and outputs the sample signal S.

The first calculation circuit 321 subtracts the reference value a from the sample signal S. In this case, the reference value a, which is 1/4 in the present invention, is a ratio of the phase difference between the first signal Io and the second signal Qo and a period of the first signal Io.

If the sample signal S is 1, the output of the first calculation circuit 321 is 3/4. If the sample signal S is 0, the output of the first calculator 321 is −1/4 .

Hereinafter, the case where the output of the first calculation circuit 321 is positive corresponds to the logic signal 1, and the case where the output of the calculation circuit is negative corresponds to the logic signal 0.

The fact that the sample signal S is 1 means that the present phase difference is larger than 1/4 and therefore the loop filter 310 adjusts the delay control signal FO in a direction to reduce the delay amount of the 1-2nd delay circuit 120.

For this purpose, the loop filter 310 may subtract a predetermined value from the existing value of the delay control signal FO and designate it as a new value of the delay control signal FO.

The fact that the sample signal S being 0 means that the present phase difference is smaller than 1/4 and therefore the loop filter 310 adjusts the delay control signal FO in the direction of increasing the delay amount of the 1-2nd delay circuit 120.

To this end, the loop filter 310 may add a predetermined value to the existing value of the delay control signal FO and designate it as a new value of the delay control signal FO.

FIG. 10B illustrates a state in which the sample signal S is zero.

As the negative feedback loop is repeated, the average value of the sample signal S converges to the reference value a, and the phase difference between the reference signal A and the comparison signal B converges to 90 degrees as shown in FIG. 10C.

When the selection signal SEL is "10" or "11", the reference value a may change accordingly but the operation principle is as same as described.

The above description assumes that the circuit operates ideally. Non-ideal operation of the circuit elements included in the feedback loop can cause phase errors that do not disappear even by the feedback control, and this error can be expressed as an offset.

To eliminate this offset, the present invention provides the same input signal Io to the two inputs of the pulse generator 240.

FIG. 11 is a diagram illustrating the offset correcting operation of FIG. 2.

As described above, in this embodiment, the offset correction operation is performed when the selection signal SEL is "00".

The reference signal A is obtained by delaying the first signal Io by the 2-1st delay circuit 210 and the comparison signal B is obtained by delaying the first signal Io by the 2-2nd delay circuit 220.

The signal selector 242 generates the first intermediate signal U from the reference signal A and generates the second intermediate signal D from the comparison signal B. The pulse output circuit 241 outputs the pulse signal P from the intermediate signal U and the second intermediate signal D.

The operation of the signal selector 242 and the waveforms of the signals A, B, U and D are as described above.

The fourth calculation circuit 324 outputs a value obtained by subtracting the reference value, which is 1/2, from the sample signal S.

Considering the attributes of the first intermediate signal U and the second intermediate signal D formed in the present embodiment, the width of the pulse signal P should correspond to a half of a period of the first intermediate signal. Therefore, the reference value a is 1/2.

The loop filter 310 determines that the phase difference is greater than 180 degrees when the sample signal S is 1 and adjusts the delay control signal FO in the direction of reducing the delay amount of the 2-2nd delay circuit 220. The loop filter 310 determines that the phase difference is smaller than 180 degrees when the sample signal S is 0 and adjusts the delay control signal FO in the direction of increasing the delay amount of the 2-2nd delay circuit 220.

FIG. 11B illustrates a state in which the sample signal S is zero.

As the negative feedback loop is repeated, the average value of the sample signal S converges on the reference value a, so that the phase difference between the first intermediate signal U and the second intermediate signal D converges to 180 degrees as shown in FIG. 11C.

This indicates that the offset existing in the feedback loop has been removed.

In the embodiment, the phase error between the multi-phase signals can be corrected very accurately by performing the above-described phase correction operation and the offset correction operation alternately by adjusting the value of the selection signal SEL according to the clock signal CLK.

Figure 12:
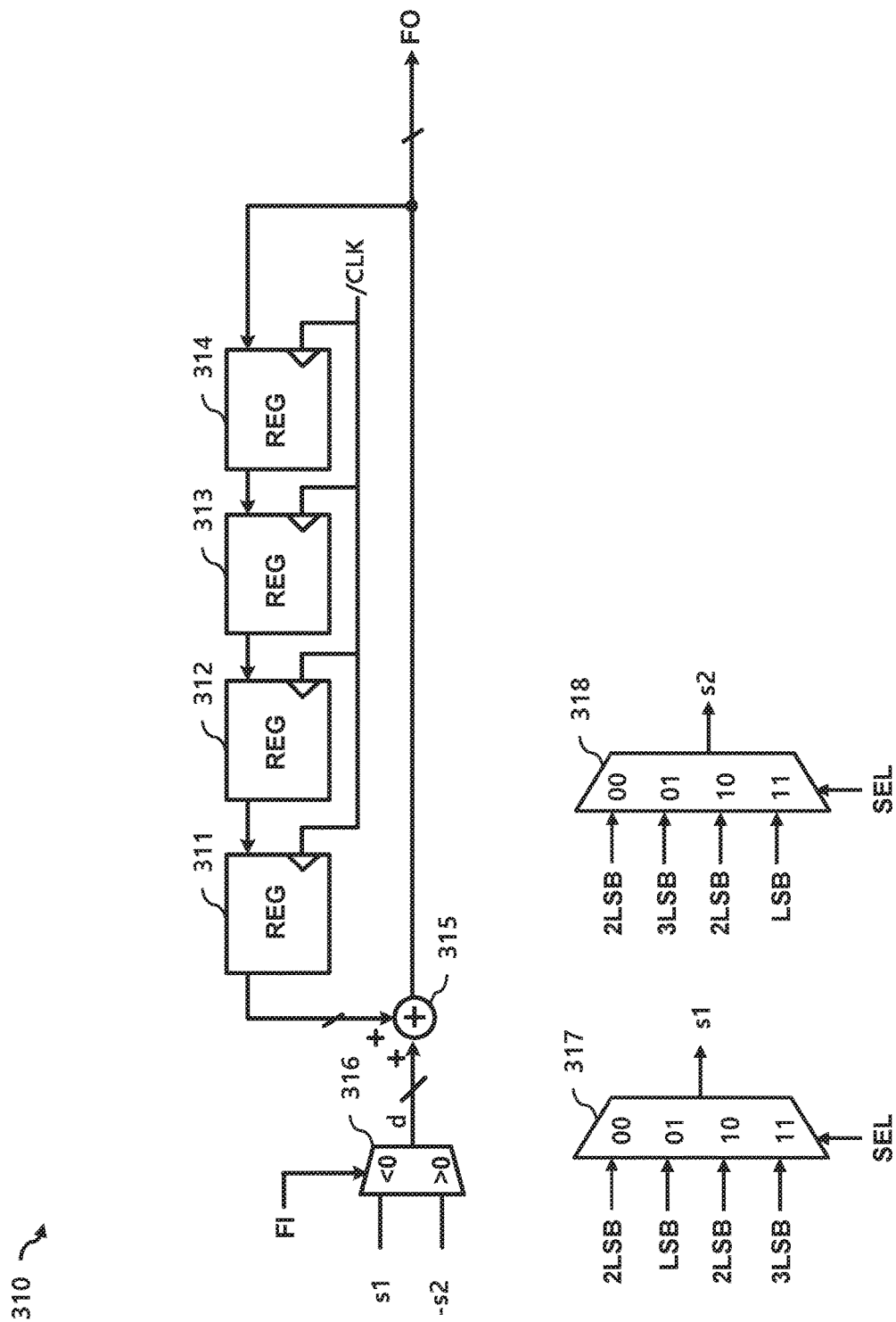
FIG. 12 is a diagram illustrating a loop filter of FIG. 2, according to an embodiment.

FIG. 12 is a detailed circuit diagram of the loop filter of FIG. 2, according to an embodiment.

In this embodiment, the loop filter 310 includes first to fourth registers 311 to 314 having a ring structure shifted by a clock signal /CLK, a fourth selector 316 selecting an adjustment value d according to an output FI of the operation circuit 320 of FIG. 2, and a filter calculation circuit 315 for adding the adjustment value d and a value of the register 311 and outputting the result as a delay control signal FO. In an embodiment, a number of bits in each of the first to fourth registers 311 to 314 is equal to a number of bits in the delay control signal FO.

The fourth selector 316 outputs the first adjustment signal s1 as the adjustment value d when the output FI of the operation circuit 320 is negative (may be indicated by a logical signal 0) and multiplies the second adjustment signal s2 by −1 as the adjustment value d when the output FI is positive (may be indicated by a logical signal 1).

The first adjustment signal s1 and the second adjustment signal s2 have positive values.

The loop filter 310 may further include a fifth selector 317 for determining the value of the first adjustment signal s1 according to the selection signal SEL and a sixth selector 318 for determining the value of the second adjustment signal s2 according to the selection signal SEL.

In this embodiment, the ratio of the first adjustment signal s1 and the second adjustment signal s2 corresponds to a ratio of a reference value provide to corresponding one of the first to fourth calculation circuits 321 to 324 and a value obtained by subtracting the reference value from 1.

The ring structure registers 311 to 314 update their values at the rising edge of the clock signal /CLK.

That is, at the rising edge of the clock signal /CLK, the register 311 is updated with a value stored in the register 312, the register 312 is updated with a value stored in the register 313, and the register 313 is updated with a value stored in the register 314, and the register 314 is updated with a value of the current delay control signal FO.

When the current selection signal SEL is "01", the result of the operation of the first calculator 321 according to a sample signal S output from the sampler 250 at the rising edge of the clock signal CLK is input to the loop filter 310.

At this time, the filter operation circuit 315 adds a previous delay control signal stored in the register 311 for the 1-2nd delay circuit 120 and the adjustment value d according to an output FI from the first calculation circuit 321 and outputs the result as a new delay control signal FO.

The selection signal SEL is updated to "10" at the falling edge of the clock signal CLK, and the values of the registers 311 to 314 are also updated as described above.

Accordingly, the register 311 outputs an existing delay control signal for the 1-3rd delay circuit 130.

Subsequent operations proceed in a similar manner.

Figure 13:
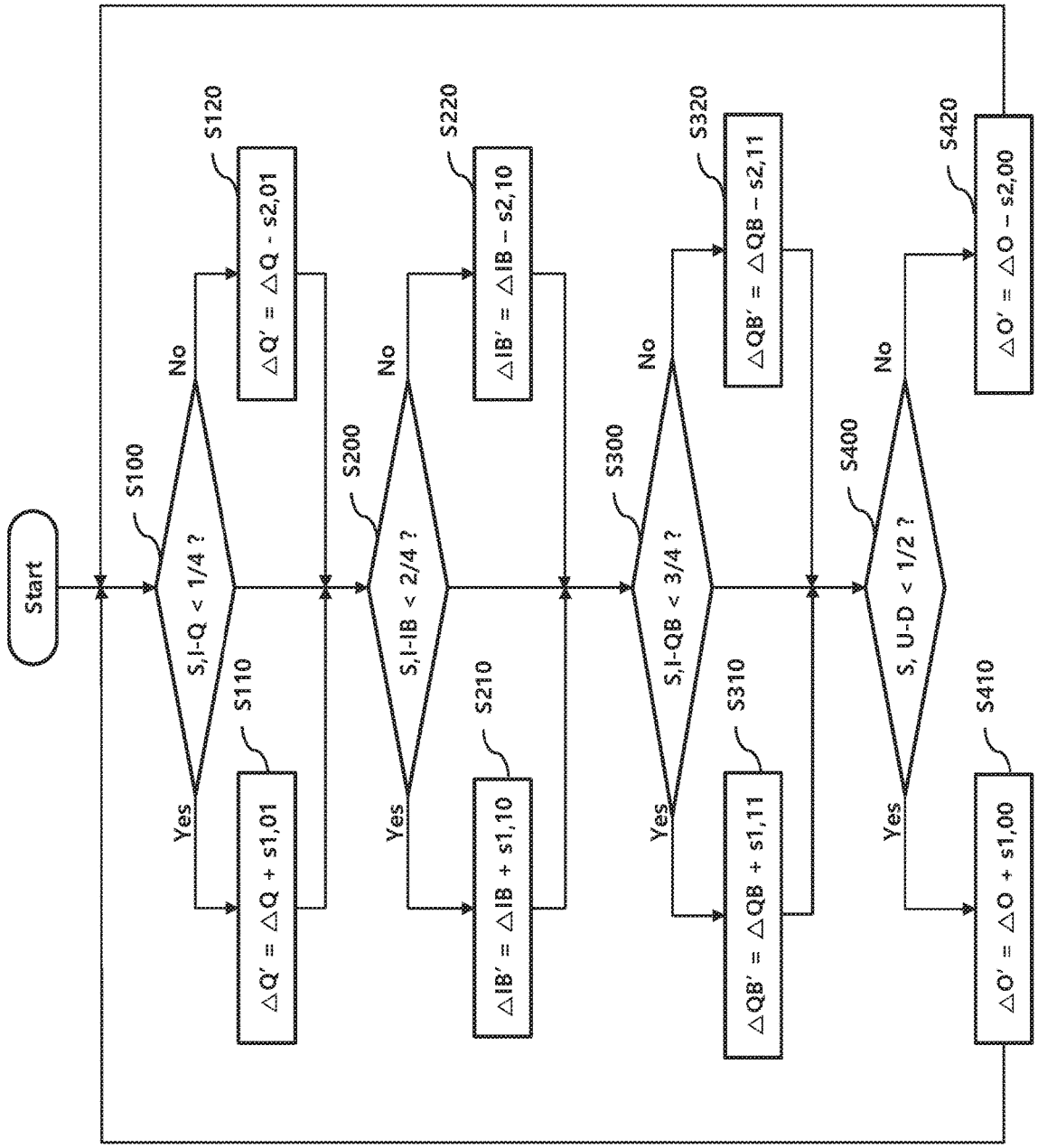
FIG. 13 is a flow chart illustrating an operation of a pulse generator of FIG. 2, according to an embodiment.

FIG. 13 is a flowchart for explaining the operation of FIG. 2, according to an embodiment.

First, the sample signal S,I-Q corresponding to the phase difference between the first signal Io and the second signal Qo is compared with 1/4 at step S100, and the sample signal S is determined to have a value of 0 or 1 accordingly.

If the sample signal S,I-Q is less than 1/4, that is, if the sample signal S is zero, the delay amount ΔQ of the second signal Qo is increased by s1,01 at step S110. Otherwise, the delay amount ΔQ of the second signal Qo is decreased by s2,01 at step S120.

In this embodiment, the ratio of s1,01 to s2,01 is 1:3. Referring to FIG. 12, s1,01 has the same value as the LSB (Lease Significant Bit) of the register 311, and s2,10 has a value obtained by multiplying the LSB by 3.

Next, the sample signals S,I-IB corresponding to the phase difference between the first signal Io and the third signal IBo are compared with 2/4 at step S200, and the sample signal S is determined to have a value of 0 or 1 accordingly.

The delay amount ΔIB of the third signal IBo is increased by s1,10 at step S210 if the sample signal S, I-IB is small, i.e., the sample signal S is zero, otherwise the delay amount ΔIB of the third signal IBo is decreased by s2,10 at step S220.

In this embodiment, the ratio of s1,10 to s2,10 is 2:2. Referring to FIG. 12, both s1,10 and s2,10 have the same value which is twice as the LSB of the register 311.

Next, the sample signals S,I-QB corresponding to the phase difference between the first signal Io and the fourth signal QBo are compared with 3/4 at step S400, and the sample signal S is determined to have a value of 0 or 1 accordingly.

If the sample signal S is 0, the delay amount ΔQB of the fourth signal QBo is increased by s1,11 at step S310 if the sample signals S,I-QB are small, otherwise the delay amount ΔQBo of the fourth signal QBo is decreased by s2,11 at step S320.

In this embodiment, the ratio of s1,11 to s2,11 is 3:1. Referring to FIG. 12, s1,11 has a value obtained by multiplying the LSB of the register 311 by 3, and s2,11 has a value as same as the LSB of the register 311.

Next, the sample signals S,U-D corresponding to the phase difference between the first intermediate signal U and the second intermediate signal D generated from the first signal Io are compared with 2/4 at step S400, and the sample signal S is determined to have a value of 0 or 1 accordingly.

If the sample signal S,U-D is small, that is, if the sample signal S is 0, the delay amount ΔO of the 2-2nd delay circuit 220 is increased by s1,00 at step S410, otherwise the delay amount ΔO of the 2-2nd delay circuit 220 is decreased by s2,00 at step S420.

In the present embodiment, the ratio of s1,00 to s2,00 is 1:1. Referring to FIGS. 12, s1,00 and s2,00 have the same value which is twice of the LSB of the register 311.

Then, the above-described operation is repeated.

Figure 14:
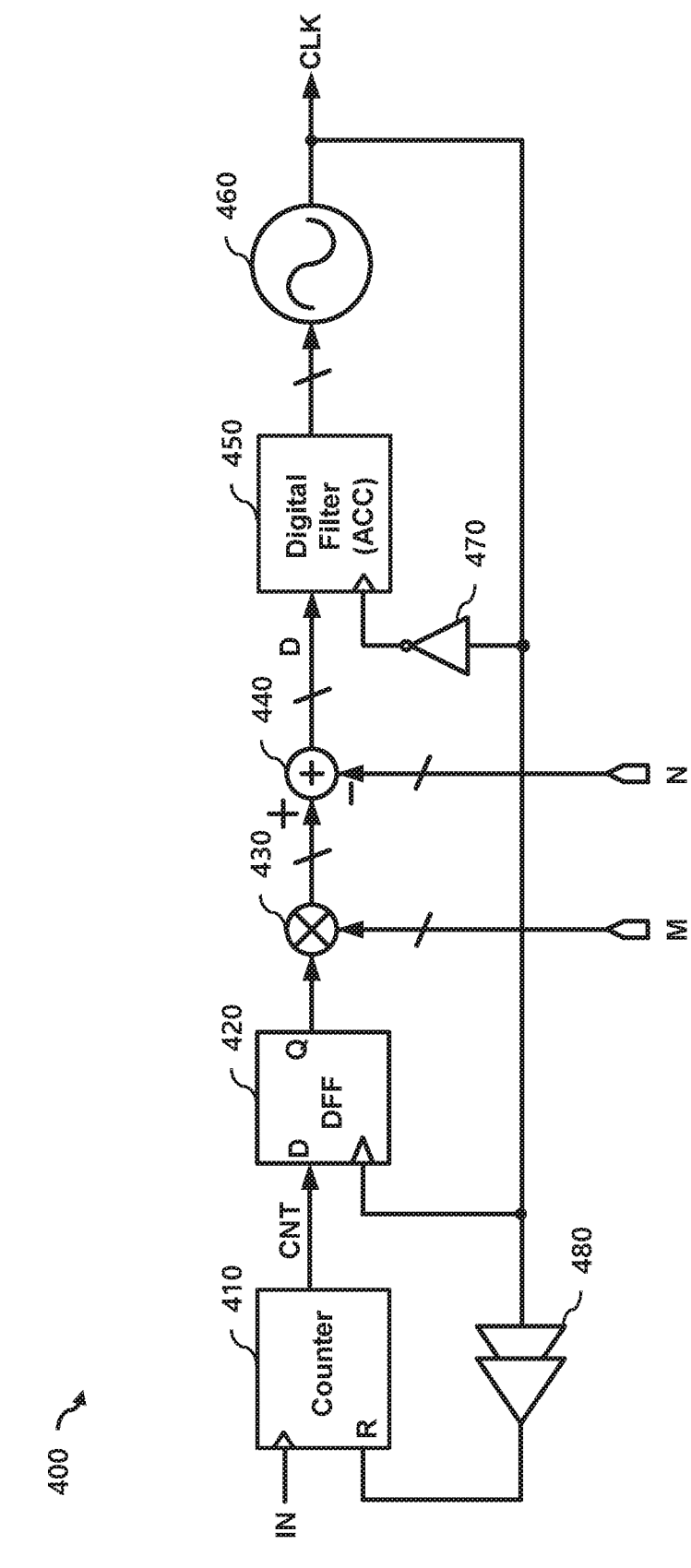
FIG. 14 is a diagram illustrating a clock generator of FIG. 2, according to an embodiment.

FIG. 14 is a detailed circuit diagram of the clock generator 400 of FIG. 2, according to an embodiment.

In this embodiment, the clock generator 400 outputs a clock signal CLK that is not synchronized with the input signal IN.

As shown in FIG. 2, in this embodiment, the input signal IN uses the first signal Io.

The relationship between the period TIN of the input signal IN and the period TCLK of the clock signal CLK is as shown in Equation 1. In this embodiment, M and N are natural numbers and relatively prime.

The clock generator 400 includes a counter 410, a flip-flop 420, a multiplier circuit 430, a subtractor circuit 440, an accumulator circuit 450 that acts as a digital filter circuit, and a digitally controlled oscillator 460.

The digitally controlled oscillator 460 outputs the clock signal CLK in accordance with the output of the accumulator circuit 450.

In the present embodiment, the counter 410 is a 1-bit counter that alternately outputs 0 and 1 at the rising edge of the input signal IN. The counter 410 resets the count value CNT at the rising edge of the buffer 480 that buffers and outputs the clock signal CLK.

Accordingly, the counter 410 outputs 0 when the number of the rising edges of the input signal IN during one period of the clock signal CLK is an even number, and outputs 1 when the number is an odd number.

The flip-flop 420 latches the count value CNT at the rising edge of the clock signal CLK.

Since the buffer 480 delays the clock signal CLK, the count value CNT of the counter 410 is reset to 0 after the flip-flop DFF latches the count value CNT.

The multiplier circuit 430 multiplies the output of the flip flop 420 by M and the subtractor circuit 440 subtracts N from the output of the multiplier circuit 430.

In the present embodiment, M and N are natural numbers and are relatively prime, where M is larger than N.

The accumulator circuit 450 is a kind of digital filter circuit that receives the output of the inverter 470 which inverts the clock signal CLK as a clock input.

In this embodiment, the accumulator circuit 450 accumulates the output D of the subtractor circuit 440.

Figure 15:
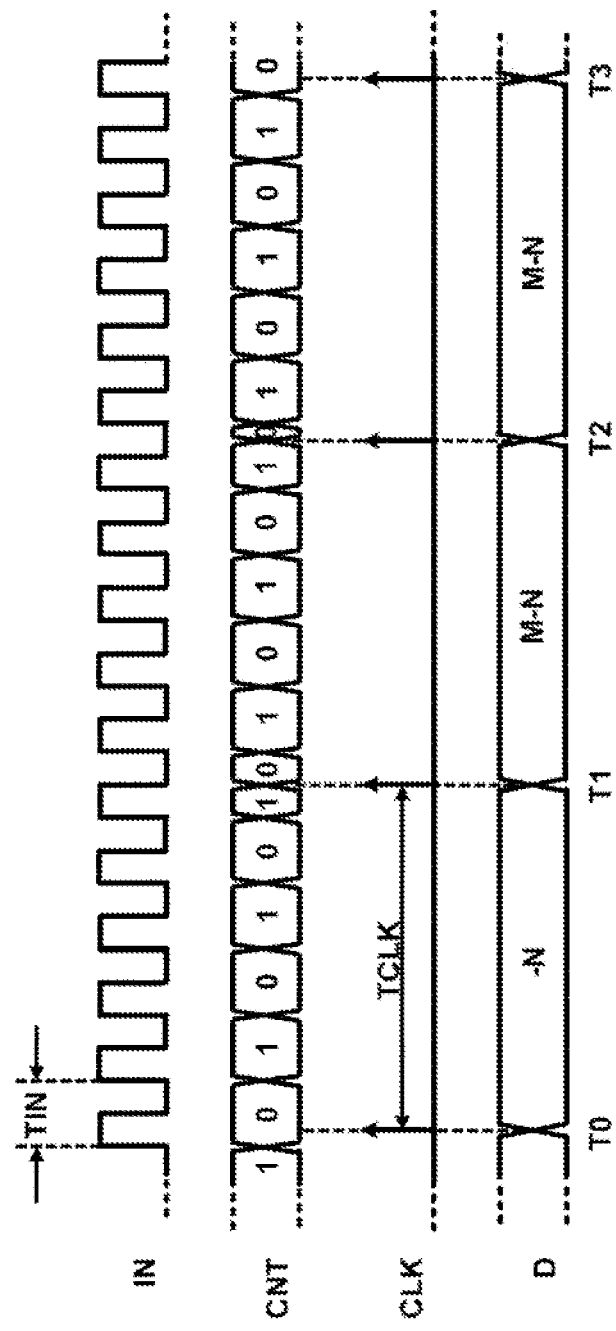
FIG. 15 is a diagram illustrating an operation of the clock generator of FIG. 14, according to an embodiment.

FIG. 15 is a timing diagram illustrating the operation of FIG. 14, according to an embodiment.

When the output of the flip-flop 420 is 0, the output of the multiplier circuit 430 is 0, and the output D of the subtractor circuit 440 is −N because the count value CNT is 0 at T0.

The value of the accumulator circuit 450 decreases at the falling edge of the clock signal CLK and the frequency of the digitally controlled oscillator 460 decreases.

When the count value CNT at T1 is 1, the flip-flop 420 latches 1 at the rising edge of the clock signal CLK.

Since the buffer 480 outputs the clock signal CLK with a slight delay, the count value CNT is reset to 0 after the flip-flop 420 latches the count value CNT, which is 1, at the rising edge of the clock signal CLK.

Accordingly, the output D of the subtractor circuit 440 becomes M−N, and the value of the accumulator circuit 450 increases at the falling edge of the clock signal CLK to increase the frequency of the digitally controlled oscillator 460.

Since the count value CNT is 1 at T2, the flip-flop 420 latches 1 at the rising edge of the clock signal CLK.

Because the buffer 480 outputs the clock signal CLK with a slight delay, the count value CNT is reset to 0 after the flip-flop 420 latches the count value CNT, which is 1, at the rising edge of the clock signal CLK.

Accordingly, the output D of the subtractor circuit 440 becomes M−N, and the value of the accumulator circuit 450 increases at the downward edge of the clock signal CLK to increase the frequency of the digitally controlled oscillator 460.

Thereafter, a similar operation is repeated.

If the time passes sufficiently, the average of the values D output from the subtractor circuit 440 converges to zero through the negative feedback operation.

In this state, a (a is a natural number) represents a number of times when the output D of the subtractor circuit 440 is M−N, and b (b is a natural number) represents a number of times when the output D of the subtractor circuit 440 is −N.

It may be assumed that one period TCLK of the clock signal CLK is an odd number (2k+1, k is a natural number equal to or greater than 1) of the period TIN of the input signal IN when the output D of the subtractor circuit 440 is M−N and one period TCLK of the clock signal CLK corresponds to an even number (2k) times of the period TIN of the input signal IN when the output D of the subtractor circuit 440 is −N.

Accordingly, the following equations 2 and 3 are established.

$$(a+b)\text{TCLK} = a(2k+1)\text{TIN} + b(2k)\text{TIN} \qquad \text{[Equation 2]}$$

$$a(M-N) + b(-N) = 0 \qquad \text{[Equation 3]}$$

Equation 4 may be obtained from Equations 2 and 3.

$$\text{TCLK} = (2k + N/M)\text{TIN} \qquad \text{[Equation 4]}$$

Equation 4 corresponds to Equation 1.

Thus, the clock signal CLK that is not synchronized with the input signal IN can be generated through the circuit of FIG. 14.

The above-described embodiment can be easily changed for a multi-phase signal other than four-phase signals. For example, the number of delay units included in the first delay circuit 100 may be changed to match the number of the multi-phase signals and the number of other related components may be adjusted, which will be easily understood by a person skilled in the art with reference to the drawings and the description of the invention, therefore a detailed description thereof will be omitted.

Although various embodiments have been described for illustrative purposes, it will be apparent to those skilled in the art that various changes and modifications may be made without departing from the spirit and scope of the invention as defined in the following claims.

What is claimed is:

1. An asynchronous clock signal generator circuit comprising:
   a counter configured to count the input signal for one period of a clock signal;
   a flip-flop configured to latch an output of the counter according to the clock signal;
   a multiplier circuit configured to multiply an output of the flip-flop by M, where M is a natural number greater than 1;
   a subtractor circuit configured to subtract N from an output of the multiplier circuit, where N is a natural number smaller than M, and M and N are relatively prime;
   a digital filter circuit configured to filter an output of the subtractor circuit according to the clock signal; and
   a digitally controlled oscillator circuit configured to output the clock signal according to an output of the digital filter.

2. The asynchronous clock signal generator circuit of claim 1, wherein the counter is 1-bit counter.

3. The asynchronous clock signal generator circuit of claim 2, wherein the counter is reset at a given time after a rising edge of the clock signal.

4. The asynchronous clock signal generator circuit of claim 1, wherein the digital filter circuit comprises an accumulator circuit configured to accumulate the output of the subtractor circuit according to the clock signal.

5. The asynchronous clock signal generator circuit of claim 1, wherein the flip-flop is configured to latch the output of the counter at the rising edge of the clock signal and the digital filter circuit is configured to accumulate the output of the subtractor circuit at the falling edge of the clock signal.

* * * * *